(12) United States Patent
Chen et al.

(10) Patent No.: US 8,310,286 B2
(45) Date of Patent: Nov. 13, 2012

(54) CONTROLLER AND VOLTAGE DETECTION ENABLING CIRCUIT THEREOF

(75) Inventors: Ji-Ming Chen, Wuxi (CN); Huan-Wen Chien, Taipei County (TW)

(73) Assignee: Green Solution Technology Co., Ltd., Taipei County (TW)

( * ) Notice: Subject to any disclaimer, the term of this patent is extended or adjusted under 35 U.S.C. 154(b) by 226 days.

(21) Appl. No.: 12/731,358

(22) Filed: Mar. 25, 2010

(65) Prior Publication Data
US 2010/0244912 A1 Sep. 30, 2010

(30) Foreign Application Priority Data
Mar. 26, 2009 (TW) .............................. 98109815 A

(51) Int. Cl.
H03L 7/00 (2006.01)
(52) U.S. Cl. .......................................................... 327/143
(58) Field of Classification Search .................. None
See application file for complete search history.

(56) References Cited

U.S. PATENT DOCUMENTS 7,550,958 B2   6/2009  Lee et al.
7,639,052 B2 * 12/2009 Xiao et al. ..................... 327/143
2004/0201413 A1* 10/2004 Mercier ......................... 327/493
2005/0162207 A1*  7/2005 Kamei ........................... 327/205
2007/0001720 A1*  1/2007 Li et al. ......................... 327/143

FOREIGN PATENT DOCUMENTS
TW       200640136      11/2006
TW       I307002 B       3/2009

OTHER PUBLICATIONS

A communication dated May 4, 2012 (101-5-4) from a foreign patent office regarding a related copending patent application citing the references submitted in this IDS.

* cited by examiner

Primary Examiner — Lincoln Donovan
Assistant Examiner — Daniel Rojas
(74) Attorney, Agent, or Firm — Rosenberg, Klein & Lee

(57) ABSTRACT

A voltage detection enabling circuit is disclosed. The voltage detection enabling circuit includes a reference voltage generating unit, an enabling protection unit, and an enabling judgment unit. The reference voltage generating unit is coupled to a driving voltage, and generates a reference voltage signal. The enabling protection unit receives the reference voltage signal and outputs an enabling judgment signal when the reference voltage signal is higher than a voltage parameter. Particularly, the voltage parameter is a component parameter of an electronic component. Then the enabling judgment unit determines whether an enabling signal is generated or not according to the enabling judgment signal and the driving voltage.

17 Claims, 6 Drawing Sheets

CONTROLLER AND VOLTAGE DETECTION ENABLING CIRCUIT THEREOF

BACKGROUND OF THE INVENTION

1. Field of the Invention

The present invention relates to a controller and a voltage detection enabling circuit thereof, especially to a voltage detection enabling circuit which determines whether or not to enable a function circuit according to a voltage parameter of a transistor.

2. Description of the Related Art

Because a power supply provided to devices inside an electronic circuit is not stable enough during the beginning when the electronic circuit is enabled, it may frequently cause erroneous operation during the period that the electronic circuit starts to operate. For avoiding the occurrence of the erroneous operation on account of unstable power supply during the beginning, a predetermined voltage value is generally set to determine whether the driving voltage is stable enough or not. The electronic circuit is then enabled only if the driving voltage reaches the predetermined voltage value.

Please refer to FIG. 1, which is the circuit diagram of under voltage lockout (UVLO) circuit of the prior art. The UVLO circuit includes a voltage divider which has resisters RD1 and RD2, a reference voltage generator VG, a comparator COM, and an AND gate AND. In which the voltage divider is coupled with a driving voltage VCC in order to generate a divided voltage signal V1.

A non-inverting input terminal of the comparator COM receives the divided voltage signal V1. An inverting input terminal of the comparator COM receives a reference voltage signal VREF generated by the reference voltage generator VG. A comparison signal CMP is generated when the divided voltage signal V1 is higher than the reference voltage signal. The AND gate AND receives the comparison signal CMP and a delay signal DELAY. When both the comparison signal CMP and the delay signal DELAY are high, an enabling signal UVLO is outputted for enabling an electronic circuit formally.

Please refer now to FIG. 2, which shows the timing diagram of the under voltage lockout circuit in FIG. 1. After the circuit is enabled, the driving voltage VCC increases, so the divided voltage signal V1 increases accordingly. Because the reference voltage generator VG is also driven by the driving voltage VCC, the reference voltage generator VG starts to generate the reference voltage signal VREF when the driving voltage VCC increases and reaches the potential level which is capable to drive the reference voltage generator VG. At time point t1, the reference voltage generator VG starts to generate the reference voltage signal VREF. However, the reference voltage signal VREF reaches a steady value only when the driving voltage VCC increases and reaches a higher potential level.

As the time the reference voltage generator VG is driven and enabled, the comparator COM is also enabled. At the moment. Because the reference voltage signal VREF is lower then the divided voltage signal V1 during the beginning of the reference voltage generator VG, the potential of outputted comparison signal CMP is high. At time point t3, the potential level of the reference voltage signal VREF rises and becomes higher than the divided voltage signal V1, the comparator COM stops outputting the comparison signal CMP since the potential of the comparison signal CMP is low.

For avoiding the comparator COM from performing wrong comparison because of the unstable reference voltage signal VREF during the beginning of the reference voltage generator VG, a delay signal DELAY is provided. The delay signal DELAY is set to generate a delay time Td after the circuit is enabled.

The delay signal DELAY is adopted to avoid the erroneous judgment. However, the rising speed of driving voltage VCC in different power supply is different, the comparison may still err for the slow rising speed of the driving voltage VCC. As shown in the present case, the time point t2 of the delay signal DELAY generating comes before the time point t3, thus during the period between t2 and t3, the enabling signal UVLO may still provide error output. Until the time point t4, the divided voltage signal V1 becomes higher than the stable reference voltage signal VREF again, so the enabling signal UVLO is outputted correctly.

As described above, the prior under voltage lockout circuit may still possibly make wrong determination, trigger error actions, and further cause circuit damage. Therefore, the problem is what should be overcome.

SUMMARY OF THE INVENTION

In view of above-described issues, a controller and its voltage detection enabling circuit of the present invention is used to determine the state of the reference voltage generating unit according to the parameter of transistor, for properly postponing the judgment for determining whether or not to enable of the electronic circuit.

In order to achieve the aforementioned purposes, the present invention provides the voltage detection enabling circuit, which includes a reference voltage generating unit, an enabling protection unit, and an enabling judgment unit.

In which, the reference voltage generating unit is coupled with a driving voltage, and is for generating a reference voltage signal. The enabling protection unit receives the reference voltage signal, and outputs an enabling judgment signal when the reference voltage signal is higher than a voltage parameter representative of a transistor parameter. In addition, the enabling judgment unit is for determining whether to generate an enabling signal or not according to the enabling judgment signal and the driving voltage.

The present invention also discloses another voltage detection enabling circuit, which includes a reference voltage generating unit, an enabling judgment unit, and an enabling protection unit.

Wherein the reference voltage generating unit is coupled with a driving voltage, and is for generating a reference voltage signal. The enabling judgment unit is for determining whether or not to generate an enabling signal according to a potential signal representative of the driving voltage. The enabling protection unit is coupled with the enabling judgment unit, in which the enabling protection unit is for determining whether to stop the enabling judgment unit from generating the enabling signal according to the reference voltage signal.

Furthermore, the present invention provides a controller, which includes a voltage detection enabling circuit and a function circuit.

Wherein, the voltage detection enabling circuit is coupled with a driving voltage for generating a reference voltage signal, and for determining whether to generate an enabling signal or not according to the driving voltage when the reference voltage signal is higher than a voltage parameter representative of a transistor parameter. Additionally, the function circuit is coupled with the driving voltage to receive power for operating and converts at least one input signal into at least one output signal according to a predetermined function when the function circuit receives the enabling signal.

For further understanding of the invention, reference is made to the following detailed description illustrating the embodiments and examples of the invention. The description is only for illustrating the invention, not for limiting the scope of the claim.

BRIEF DESCRIPTION OF THE DRAWINGS

The drawings included herein provide further understanding of the invention. A brief introduction of the drawings is as follows.

DETAILED DESCRIPTION OF THE PREFERRED EMBODIMENTS

Figure 1:
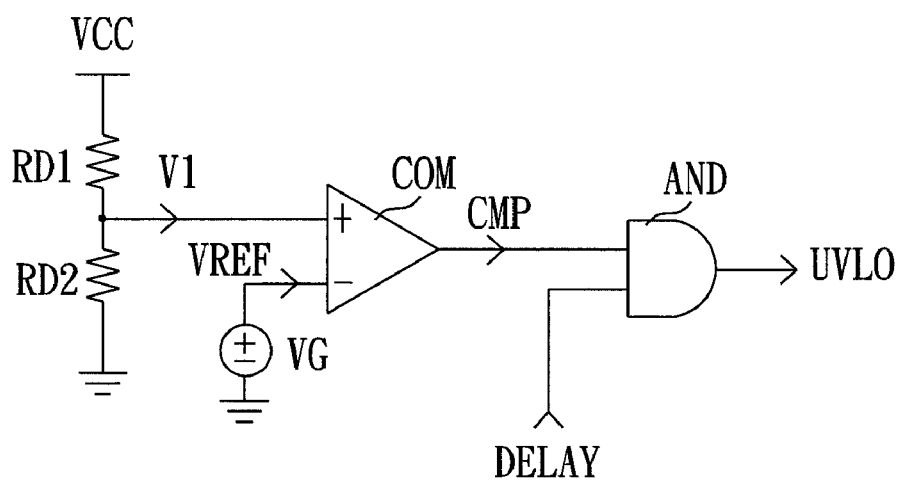
FIG. 1 is a circuit diagram of the prior under voltage lockout circuit.
Figure 2:
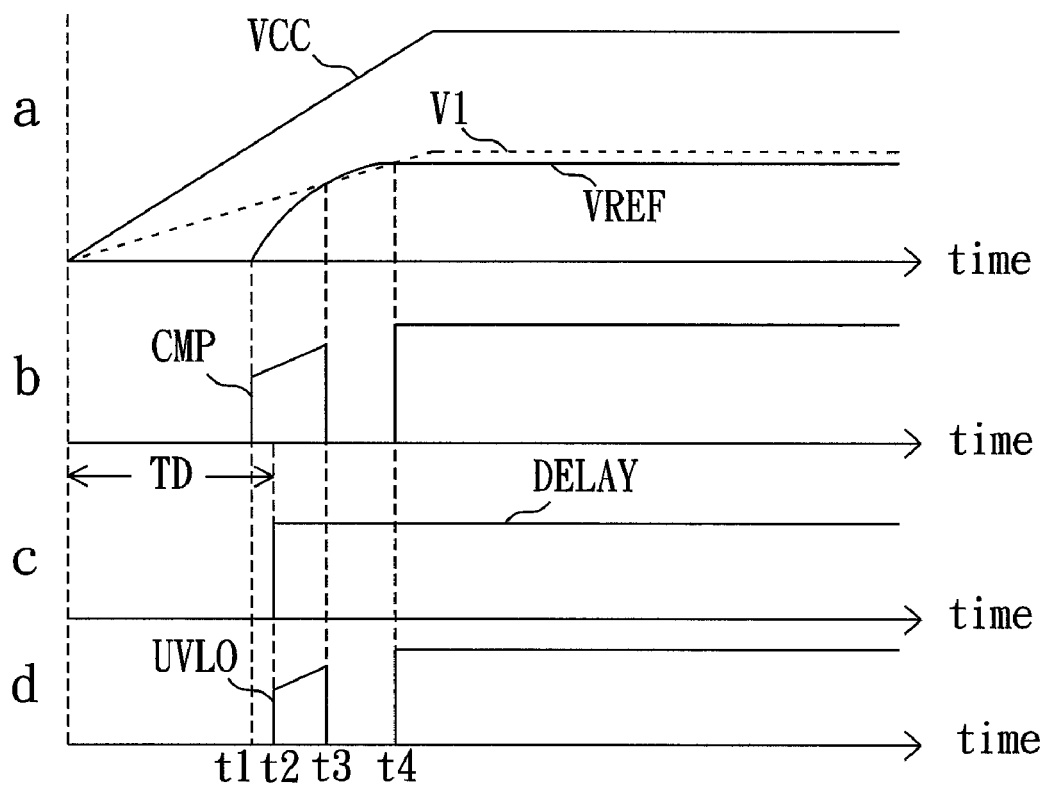
FIG. 2 is a timing diagram of the prior under voltage lockout circuit in FIG. 1.
Figure 3:
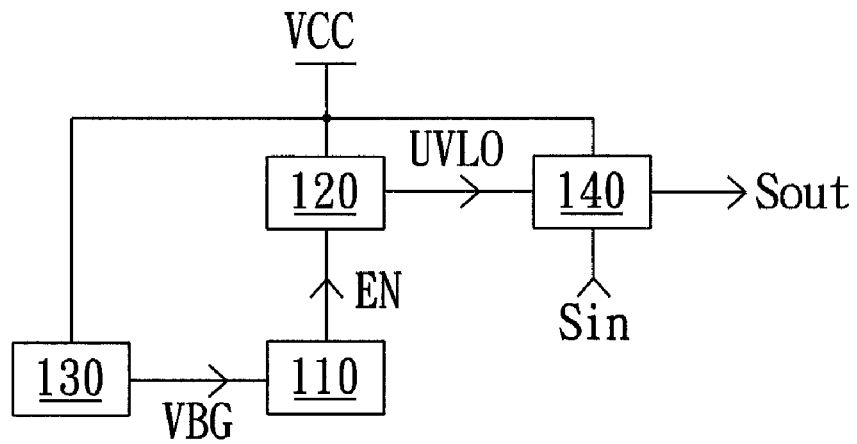
FIG. 3 is a circuit diagram of a preferred embodiment of the controller using a voltage detection enabling circuit according to the present invention.

Please refer to FIG. 3, which is a circuit diagram of a preferred embodiment of a controller with voltage detection enabling circuit. The controller includes a voltage detection enabling circuit and a function circuit 140. The voltage detection enabling circuit has an enabling protection unit 110, an enabling judgment unit 120, and a reference voltage generating unit 130. In which, the reference voltage generating unit 130 is coupled with a driving voltage VCC, and generates a reference voltage signal VBG.

The enabling protection unit 110 includes a build-in electronic component, which has some component parameters. Further, the enabling protection unit 110 receives reference voltage signal VBG, and outputs an enabling judgment signal EN when the reference voltage signal VBG is higher than a voltage parameter representative of the component parameter. When receiving the enabling judgment signal EN, the enabling judgment unit 120 starts to determine whether the driving voltage VCC reaches a predetermined voltage potential value. If the driving voltage VCC reaches the predetermined voltage potential value, the enabling judgment unit 120 then generates an enabling signal UVLO.

Additionally, the function circuit 140 is coupled with the driving voltage VCC in order to receive power for operating. The function circuit 140 starts to operate when receiving the enabling signal UVLO, for converting an input signal Sin to an output signal Sout according to a predetermined function.

Wherein, the function circuit 140 can be any kind of circuit capable of processing and calculating. The function circuit 140 is used for generating at least one output signal with predetermined functions according to the signals provided by other circuits or according to the feedback signals. For example, the function circuit can be an AC to DC converting control circuit, a DC to DC converting control circuit, a DC to AC converting control circuit, an analog to digital converter circuit, a digital to analog converter circuit, LED driving control circuit, or battery charging control circuit, etc.

Figure 4:
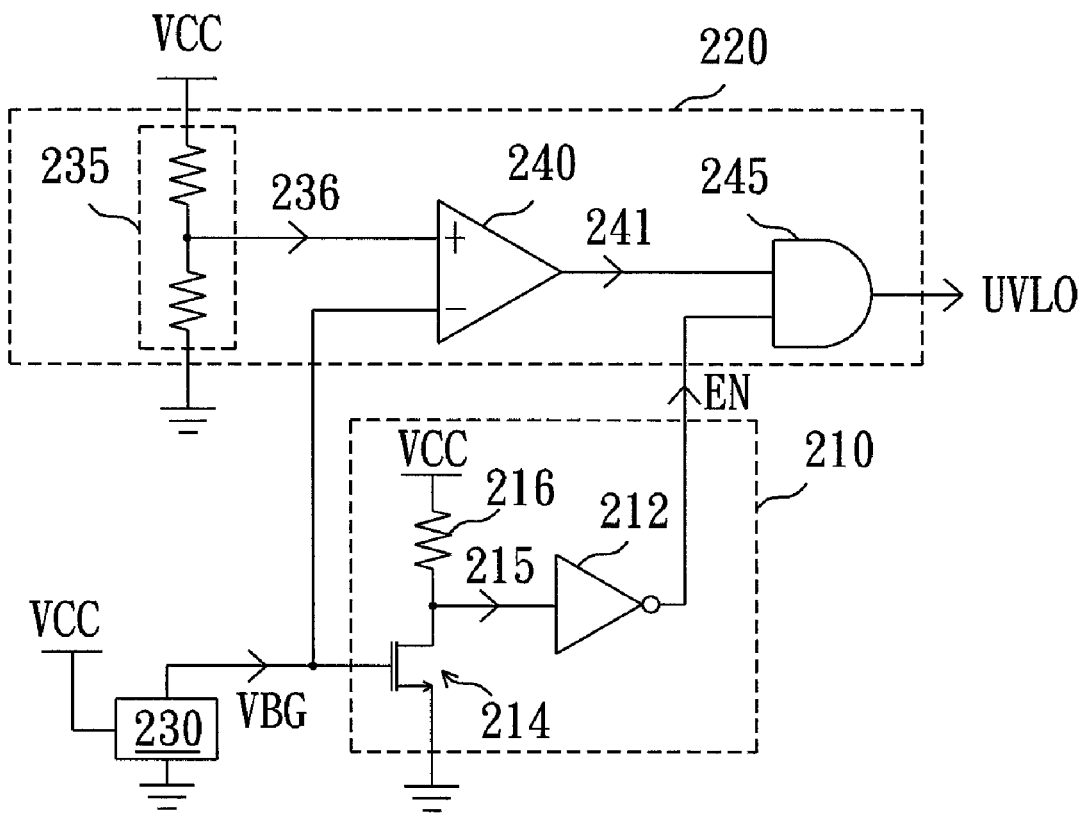
FIG. 4 is a circuit diagram of a first preferred embodiment of the voltage detection enabling circuit according to the present invention.

Next, please refer to FIG. 4, which shows a circuit diagram of a first preferred embodiment of a voltage detection enabling circuit. The voltage detection enabling circuit includes an enabling protection unit 210, an enabling judgment unit 220, and a reference voltage generating unit 230. In which, the reference voltage generating unit 230 is coupled with a driving voltage VCC, and is used for generating a reference voltage signal VBG.

The enabling protection unit 210 has an inverter 212, a transistor component 214, and a resistor 216. Wherein the transistor component 214 can be a MOS transistor, which has a control end, a first end, and a second end. In which, the control end is coupled with the reference voltage generating unit 230, and receives reference voltage signal VBG. The first end is coupled with the resistor 216, and is coupled with the enabling judgment unit 220 through the inverter 212. The second end is grounded.

Further, the other side of the resistor 216 is coupled with the driving voltage VCC for generating a voltage signal 215 and sends the voltage signal 215 to the inverter 212. Then, the inverter 212 inverts the voltage signal 215 into an enabling judgment signal EN.

The enabling judgment unit 220 includes a voltage divider 235, a comparator 240, and an AND gate 245. Wherein the voltage divider 235 is coupled with the driving voltage VCC and generates a driving divided voltage signal 236. The non-inverting input terminal of comparator 240 receives the driving divided voltage signal 236, and the inverting input terminal of the comparator 240 receives the reference voltage signal VBG. The comparator 240 compares the driving divided voltage signal 236 with the reference voltage signal VBG and then generates a comparison signal 241. Further, the AND gate 245 receives the comparison signal 241 and the enabling judgment signal EN, and outputs the enabling signal UVLO.

Figure 5:
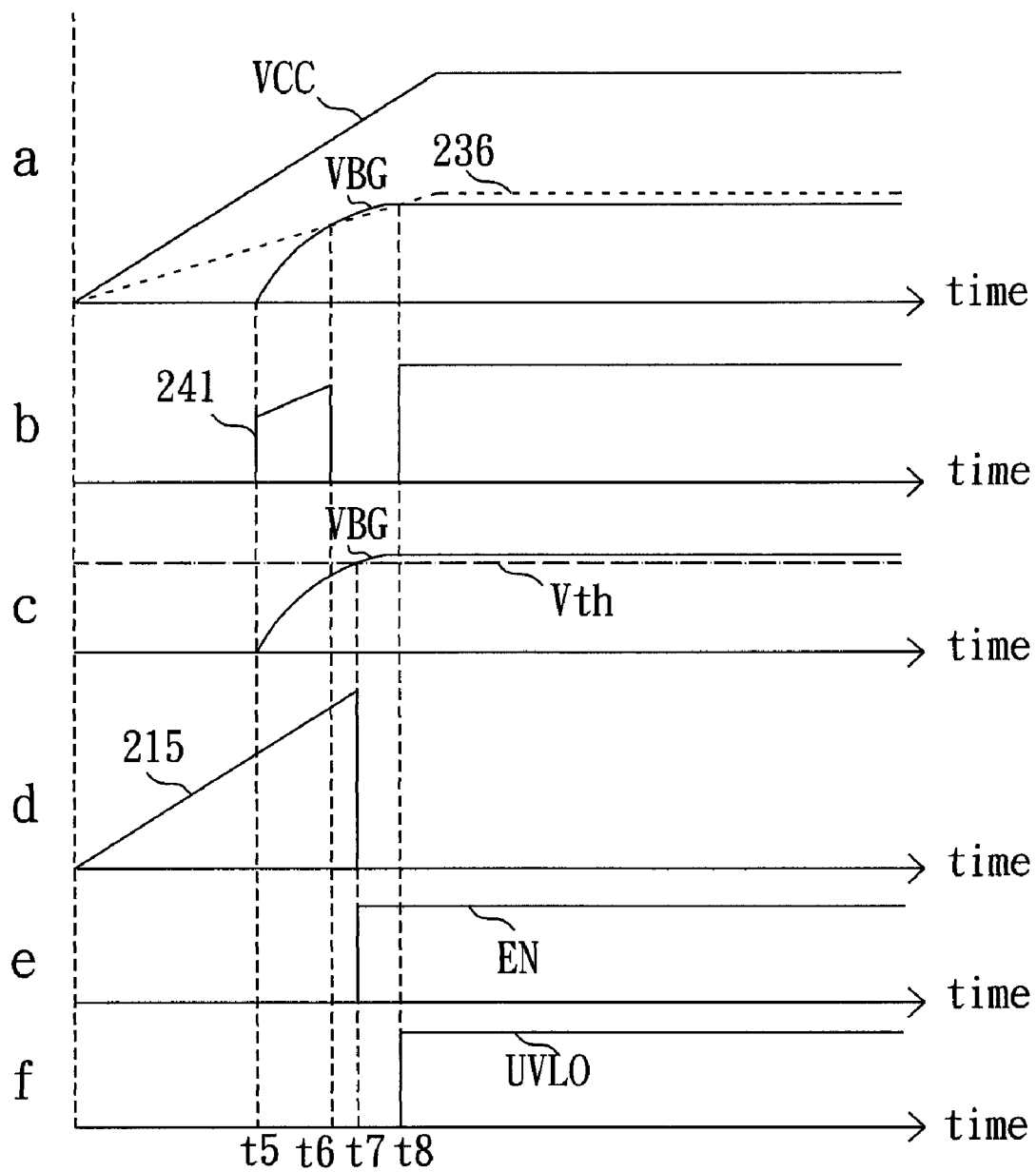
FIGS. 5a~5f are the timing diagrams of the voltage detection enabling circuit shown in FIG. 4.

Please refer to FIGS. 5a~5f, which show several timing diagrams of the voltage detection enabling circuit as shown in FIG. 4. As shown in FIG. 5a, the driving voltage VCC increases gradually after the circuit starts, and the driving divided voltage signal 236 also increases simultaneously. At time point t5, when the driving voltage VCC increases and reaches the potential level which is able to activate the reference voltage generating unit 230. The reference voltage generating unit 230 starts to generate the reference voltage signal VBG. Since the driving voltage VCC still increases gradually, the reference voltage signal VBG eventually becomes higher than the driving voltage VCC at time point t6.

Now referring to FIG. 5b, the comparator 240 also activates around the activated timing of the reference voltage generating unit 230. At the moment, the reference voltage signal VBG is lower than the driving divided voltage signal 236, so the comparison signal 241 is high until the time point t6. At the time point t6, the reference voltage signal VBG is higher than the driving divided voltage signal 236, thus the comparison signal 241 stops outputting, i.e.: the comparison signal 241 is low.

Referring to FIG. 5c, the reference voltage signal VBG is lower than the threshold voltage Vth of the transistor component 214 before time point t7 and so the transistor component 214 is in cut-off state during the period. Therefore, the potential level of the voltage signal 215 is equal to the driving voltage VCC before the time point t7. When the reference voltage signal VBG equals to the threshold voltage Vth of the transistor component 214 at time point t7, the transistor component 214 is set conductive, and the potential level of the voltage signal 215 is low (ground).

See FIG. 5d, at the moment, the voltage signal 215 is inverted by the inverter 212 to generate the high-level enabling judgment signal EN. Then please refer to FIG. 5f, the comparator 240 outputs high-level comparison signal 241 during the period between time points t5 and t6. But because the reference voltage signal VBG is still lower than the threshold voltage Vth of the transistor component 214 and the voltage signal 215 becomes high. Next, the enabling judgment signal EN inverted from the voltage signal 215 is low. Therefore, the enabling signal UVLO maintains low level.

During the period between the time points t7 and t8, reference voltage signal VBG is higher than the threshold voltage Vth of the transistor component 214 and makes the enabling protection unit 210 generate high-level enabling judgment signal EN. But at the moment, because the reference voltage signal VBG is higher than the driving divided voltage signal 236 and outputs low-level comparison signal 241, so the enabling signal UVLO still keeps at low level.

At time point t8, the comparison signal 241 and the enabling judgment signal EN are high at the same time, thus the enabling signal UVLO turns to high level for enabling the operation of the function circuit.

Therefore, as described above, the present invention uses the component parameter, such as a parameter of transistor, which is not influenced by application condition of the circuit, for determining whether or not the reference voltage signal generated by the reference voltage generating unit is proper to treat as a comparison standard of potential level. By doing this, the problem of wrongly determining the potential of driving voltage can be avoided.

Figure 6:
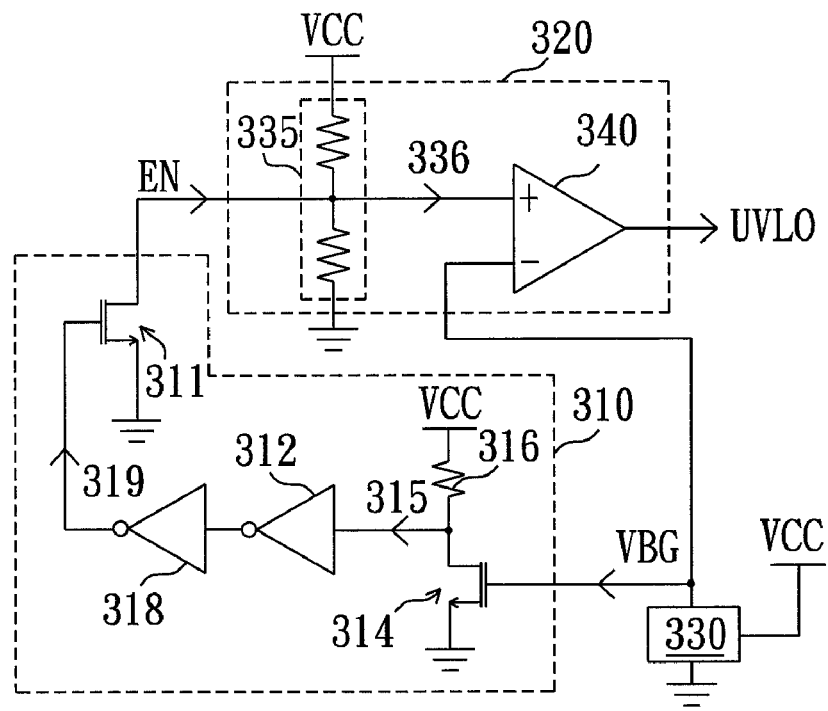
FIG. 6 is a circuit diagram of a second preferred embodiment of the voltage detection enabling circuit according to the present invention.

Please refer to FIG. 6, which shows a circuit diagram of a second preferred embodiment of voltage detection enabling circuit. The voltage detection enabling circuit includes an enabling protection unit 310, an enabling judgment unit 320, and a reference voltage generating unit 330. In which the reference voltage generating unit 330 is coupled with a driving voltage VCC and generates a reference voltage signal VBG.

The enabling protection unit 310 has a transistor switch 311, two inverters 312 and 318, a transistor component 314, and a resistor 316. In which the transistor component 314 includes a control end, a first end, and a second end. The control end is coupled to the reference voltage generating unit 330 for receiving the reference voltage signal VBG. The first end is coupled to the resistor 316, and the second end is grounded.

Additionally, the other end of the resistor 316 is coupled to the driving voltage VCC for generating a voltage signal 315. The voltage signal 315 is then inverted by the inverter 316 and 318 for enforcing the driving capability, and is converted into a driving signal 319.

Further, the drain node of the transistor switch 311 is coupled with a voltage divider 335 of the enabling judgment unit 320, for providing an enabling judgment signal EN. The source node of the transistor switch 311 is grounded, and the gate node of the transistor switch 311 receives the driving signal 319.

The enabling judgment unit 320 has the voltage divider 335 and a comparator 340. Wherein the voltage divider 335 is coupled to the driving voltage VCC and generates a driving divided voltage signal 336 at the voltage dividing point of the voltage divider 335. The non-inverting input terminal of the comparator 340 receives the driving divided voltage signal 336, and the inverting input terminal receives the reference voltage signal VBG. Then an enabling signal UVLO is generated after comparing the driving divided voltage signal 336 with the reference voltage signal VBG. In which, the enabling signal UVLO provided by the comparator 340 has a default state of low level, and in practice, it achieves by coupling a resistor (not shown) with the output terminal of the comparator 340 while the other side grounded.

Then please refer FIGS. 7a~7d, which are the timing diagrams of the voltage detection enabling circuit as shown in FIG. 6. See FIG. 7a, the driving voltage VCC increases gradually after the circuit is started. When the driving voltage VCC reaches the potential level which is enough to drive the reference voltage generating unit 330. The reference voltage generating unit 330 then starts to generate the reference voltage signal VBG, and the potential of the reference voltage signal VBG also increases gradually according to the driving voltage VCC.

Figure 7:
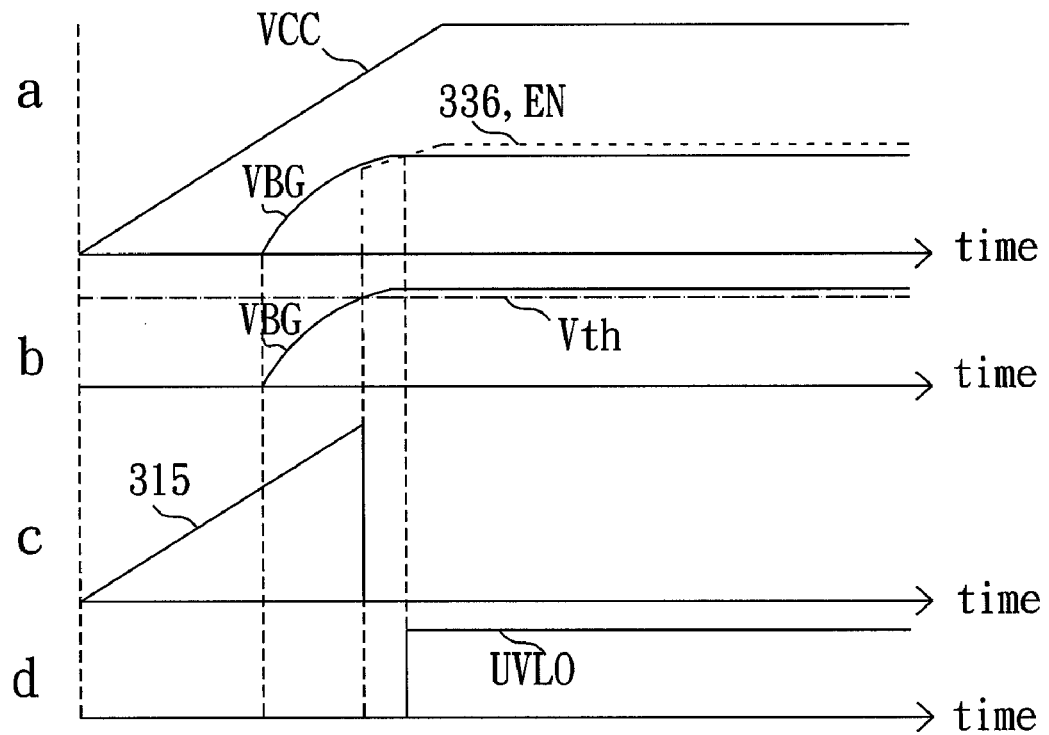
FIGS. 7a~7d are the timing diagrams of the voltage detection enabling circuit shown in FIG. 6.

Please refer to FIG. 7b and FIG. 7c, when the potential of the reference voltage signal VBG rises above the threshold voltage Vth of the transistor component 314 and makes the transistor component 314 become conductive state from cut-off state, the potential of the voltage signal 315 is changed from the potential level of the driving voltage VCC to zero (grounded).

Next, please check FIG. 7d, when the reference voltage signal VBG is lower than the threshold voltage Vth of the transistor component 314, the voltage signal 315 is at high level for making the transistor switch 311 conduct. At the moment, referring to FIG. 7a, the driving divided voltage signal 336 (enabling judgment signal EN) is low (zero) and lower than the reference voltage signal VBG, so the comparator 340 stops outputting the enabling signal UVLO.

When the reference voltage signal VBG is higher than the threshold voltage Vth of the transistor component 314, the voltage signal 315 is at low level. The transistor switch 311 is then at cut-off state. The voltage divider 335 starts to work for outputting the driving divided voltage signal 336 according to the driving voltage VCC (in the embodiment, the driving divided voltage signal 336 and the enabling judgment signal EN are coupled to the same node, so the two are the same signal). At the moment, the reference voltage generating unit 330 already generates the reference voltage signal VBG which is higher than the driving divided voltage signal 336, so the comparator still stops outputting the enabling signal UVLO.

Then, only when the driving voltage VCC further increases to proper potential level which makes the driving divided voltage signal 336 higher than the reference voltage signal VBG. The comparator 340 starts to generate the enabling signal UVLO to enable the operation of the function circuit. This can avoid the function circuit from erroneous operation due to the driving voltage VCC having too low potential level.

Figure 8:
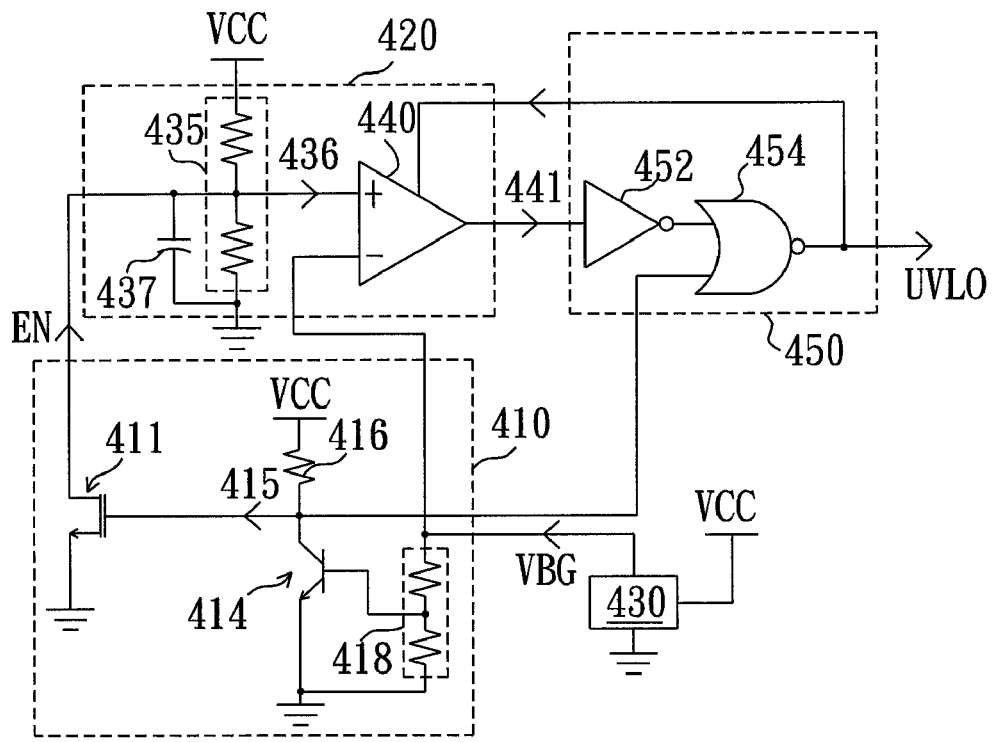
FIG. 8 is a circuit diagram of a third preferred embodiment of the voltage detection enabling circuit according to the present invention.

Please refer to FIG. 8, which is a circuit diagram of a third preferred embodiment of voltage detection enabling circuit. The voltage detection enabling circuit has an enabling protection unit 410, an enabling judgment unit 420, a reference voltage generating unit 430, and a hysteresis enabling unit

450. Wherein the reference voltage generating unit 430 is coupled with a driving voltage VCC and generates a reference voltage signal VBG.

The enabling protection unit 410 includes a transistor switch 411, a bipolar junction transistor switch 414, a resistor 416, and a voltage divider 418. In which the voltage divider 418 receives the reference voltage signal VBG for generating a divided voltage to the base of the bipolar junction transistor switch 414. The bipolar junction transistor switch 414 is biased in the forward active region when the divided voltage is higher than the forward biased voltage of the bipolar junction transistor switch 414.

In other words, the combination of the bipolar junction transistor switch 414 and the voltage divider 418 is for comparing the reference voltage signal VBG with a voltage parameter VTH' representative of the forward biased voltage of the bipolar junction transistor switch 414 (that is, the voltage parameter VTH' is the value which is the forward biased voltage divided by the division ratio of the voltage divider 418). When the reference voltage signal VBG is higher than the reference parameter VTH', the voltage signal 415 is then pulled down to generate an high-level enabling judgment signal EN through the transistor switch 411 (the drain of the transistor switch 411 is coupled to the voltage dividing point of a voltage divider 435 in the enabling judgment unit 420).

Additionally, the enabling judgment unit 420 has the voltage divider 435, a capacitor 437, and a comparator 440. In which the voltage divider 435 is coupled to the driving voltage VCC, and generates a driving divided voltage signal 436 at the voltage dividing point. The capacitor 437 is coupled to the voltage dividing point of the voltage divider 435, for filtering out the high frequency noises which may be generated while the transistor switch 411 switching. The capacitor 437 can also slow down the potential increasing rate at the voltage dividing point, for further enhancing the capability of avoiding the electrical circuit from incorrect operation.

Moreover, the non-inverting input terminal of the comparator 440 receives the driving divided voltage signal 436, and the inverting input terminal receives the reference voltage signal VBG. After comparison, a comparison signal 441 is then generated by the comparator 440 accordingly.

Furthermore, the hysteresis enabling unit 450 includes an inverter 452 and a NOR gate 454, and has the initial potential level of the enabling signal UVLO at low potential, in order to prevent the circuit from erroneous operation because of initial state being uncertain. Wherein, the inverter 452 receives the comparison signal 441 and then sends the comparison signal 441 to the NOR gate 454. The NOR gate 454 receives the output of the inverter 452 and the voltage signal 415 of the enabling protection unit 410, and outputs an enabling signal UVLO by performing "NOR" operation.

Additionally, the enabling signal UVLO is also provided for enabling a hysteresis function of the comparator 440. For example, the comparator 440 can be a comparator when the enabling signal UVLO is at low level, and be a hysteresis comparator when the comparator 440 receives the high-level enabling signal UVLO. This can prevent the comparator 440 from operating incorrectly because of the potential variation of the driving divided voltage signal 436 and/or the reference voltage signal VBG, which are induced by the noises of the circuit.

Alternatively, the comparator 440 can be a hysteresis comparator, in which the range of hysteresis voltage is small when the enabling signal UVLO is low and the range of hysteresis voltage of the comparator 440 is enlarged after receiving the high-level enabling signal UVLO, for increasing the anti-noise capability of the circuit.

Besides, because the hysteresis enabling unit 450 receives the voltage signal 415 at the same time, it is confirmed that the enabling signal UVLO is outputted only when the voltage signal 415 changes to low level. The enabling signal UVLO is avoided from outputting due to any improper operation of the enabling judgment unit 420.

Next, refer to FIGS. 9a~9d, are the timing diagram of the voltage detection enabling circuit as shown in FIG. 8. See FIG. 9a, the driving voltage VCC increases gradually after the circuit is activated. When the driving voltage VCC increases to the potential level which is enough to enable the reference voltage generating unit 430, the reference voltage generating unit 430 starts to generate the reference voltage signal VBG. Then, the reference voltage signal VBG increases with the driving voltage VCC increasing.

Figure 9:
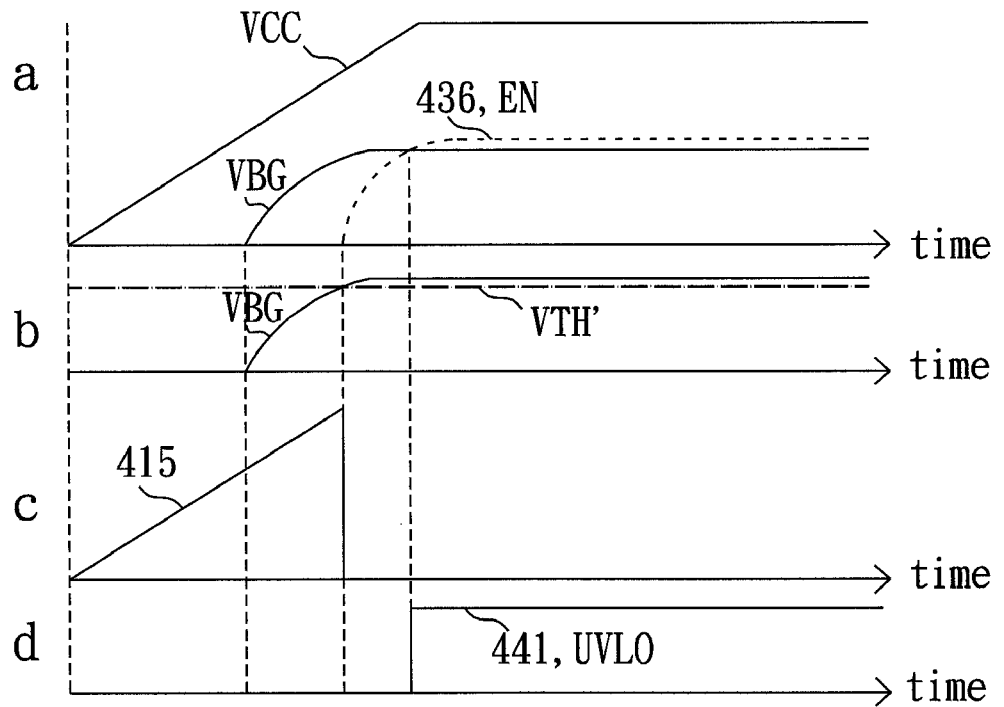
FIGS. 9a~9d are the timing diagrams of the voltage detection enabling circuit shown in FIG. 8.

Please refer to FIG. 9b, when the reference voltage signal VBG is higher than the voltage parameter VTH' which represents the forward biased voltage of the bipolar junction transistor switch 414. The bipolar junction transistor switch 414 becomes conductive state from cut-off state, thus the potential level of the voltage signal 415 decreases to zero from the driving voltage VCC.

Next, please refer to FIG. 9d, when the reference voltage signal VBG is lower than the voltage parameter VTH', the voltage signal 415 is high which makes the transistor switch 411 conducts. See FIG. 9a, at the moment, the driving divided voltage signal 436 (enabling judgment signal EN) is low so as to be lower than reference voltage signal VBG. This time, the comparator 440 stops outputting the comparison signal 441.

When the reference voltage signal VBG is higher than the voltage parameter VTH', which makes the voltage signal 415 be low and cut off the transistor switch 411, the voltage divider 435 starts to work. Therefore, the capacitor 437 starts to be charged and a voltage level of the driving divided voltage signal 436 increases gradually. At the time, the reference voltage signal VBG of reference voltage generating unit 430 is still higher than the driving divided voltage signal 436, thus the comparator 440 still stops outputting the enabling signal UVLO (i.e.: low level).

Until the driving voltage VCC further increases to proper potential level which makes the driving divided voltage signal 436 higher than the reference voltage signal VBG. The comparator 440 then starts to output the high-level comparison signal 441. The generated comparison signal 441 is then inverted to low level signal by the inverter 452. At the moment, the voltage signal 415 is also low, so the NOR gate 454 generates the high-level enabling signal UVLO, which enables the operation of the function circuit, and further enables the comparator 440 as a hysteresis comparator or adjusts the range of the hysteresis voltage of the comparator 440.

Figure 10:
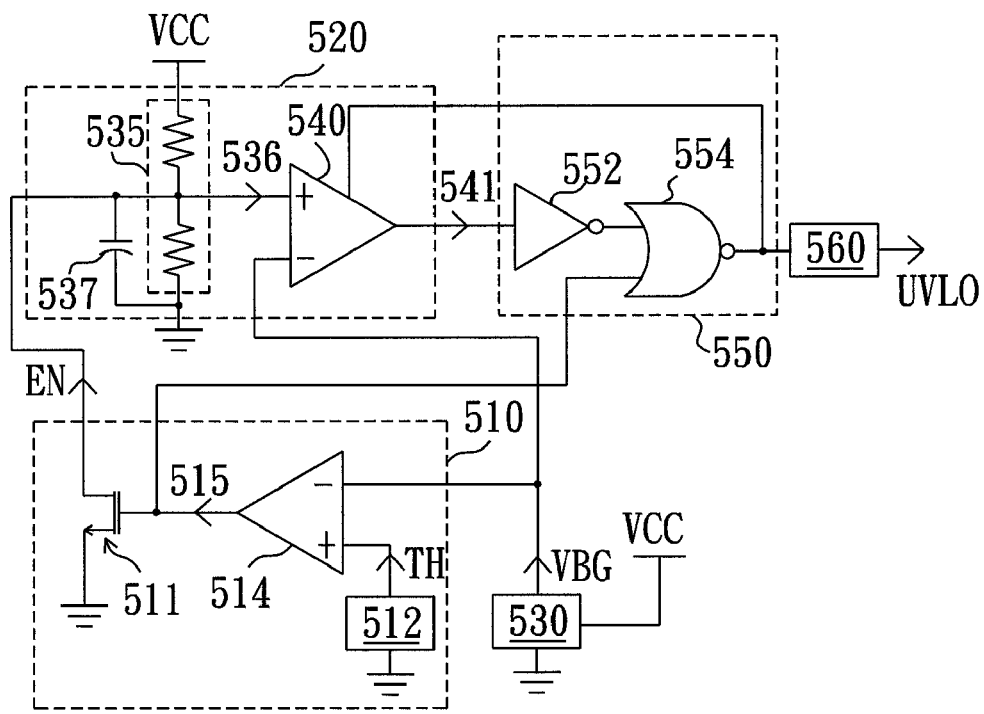
FIG. 10 is a circuit diagram of a forth preferred embodiment of the voltage detection enabling circuit according to the present invention.

Then please refer to FIG. 10, which is the circuit diagram of a forth preferred embodiment of voltage detection enabling circuit. The voltage detection enabling circuit includes an enabling protection unit 510, an enabling judgment unit 520, a reference voltage generating unit 530, a hysteresis enabling unit 550, and a delay circuit 560. The reference voltage generating unit 530 is coupled with a driving voltage VCC and is for generating a reference voltage signal VBG.

Additionally, the enabling protection unit 510 includes a transistor switch 511, a voltage parameter generator 512, and a comparator 514. In which, the non-inverting input terminal of the comparator 514 receives a voltage parameter TH generated by the voltage parameter generator 512, and the inverting input terminal of the comparator 514 receives the reference voltage signal VBG. The comparator 514 compares the two inputted signal and outputs a voltage signal 515, which controls the switching of the transistor switch 511 for generating an enabling judgment signal EN. Wherein the voltage signal 515 outputted by the comparator 514 is initially at high level, practically, it can be achieved by providing a resistor (not shown) which is coupled to the output terminal of the comparator 514 at one end, while the other end is coupled to the driving voltage VCC.

Further, the enabling judgment unit 520 includes a voltage divider 535, a capacitor 537, and a comparator 540. In which, the voltage divider 535 is coupled with driving voltage VCC, and is used for generating a driving divided voltage signal 536 at the voltage dividing point. The capacitor 537 is coupled to the voltage divider 535 at the voltage dividing point, in order to filter out the high frequency noises which are generated when the transistor switch 511 is switching, and slow down the increasing rate of the potential level at the voltage dividing point for further enhancing the capability of avoiding the electrical circuit from erroneous enabling.

The comparator 540 receives the driving divided voltage signal 536 by the non-inverting input terminal, receives the reference voltage signal VBG by the inverting input terminal, and outputs a comparison signal 541 by the output terminal.

Moreover, the hysteresis enabling unit 550 includes an inverter 552 and a NOR gate 554. In which the inverter 552 receives the comparison signal 541, and outputs the inverted signal to the NOR gate 554. The NOR gate 554 receives the signal outputted by the inverter 552 and the voltage signal 515 of the enabling protection unit and outputs an enabling signal UVLO. The outputting of the enabling signal UVLO is then delayed for a predetermined time by the delay circuit 560.

The enabling signal UVLO is also used to adjust the range of the hysteresis voltage of the comparator 540. For example, the comparator 540 can be a normal comparator when the enabling signal UVLO is low and be a hysteresis comparator when the enabling signal UVLO is high. This is for avoiding wrong determination of the comparator 540 caused by the variation of the driving divided voltage 536 and the reference voltage signal VBG induced by the electrical noises among the circuits.

Alternatively, the comparator 540 can be a hysteresis comparator, which has smaller range of hysteresis voltage when the enabling signal UVLO is low and has larger range of hysteresis voltage when the enabling signal UVLO is high. This is for enhancing the anti-noise capability of the circuits.

In addition, because the hysteresis enabling unit 550 also receives voltage signal 515 at the same time, thus it's for sure that the enabling signal UVLO is outputted only when the voltage signal 515 turns into low level. So the enabling signal UVLO can be avoided outputting due to any erroneous operation of the enabling judgment unit 520. Besides, the probability of erroneous operation may be further reduced by using the delay circuit 560 to delay the enabling signal UVLO.

Next, please refer to FIGS. 11a~11e, which is the signal timing diagram of the voltage detection enabling circuit as shown in FIG. 10. See FIG. 11a, the driving voltage VCC increases gradually after the circuit is activated. When the driving voltage VCC increases to the level that is enough to drive the reference voltage generating unit 530, the reference voltage generating unit 530 starts to generate the reference voltage signal VBG, in which the potential level of the reference voltage signal VBG increases with the potential level of the driving voltage VCC increasing.

Figure 11:
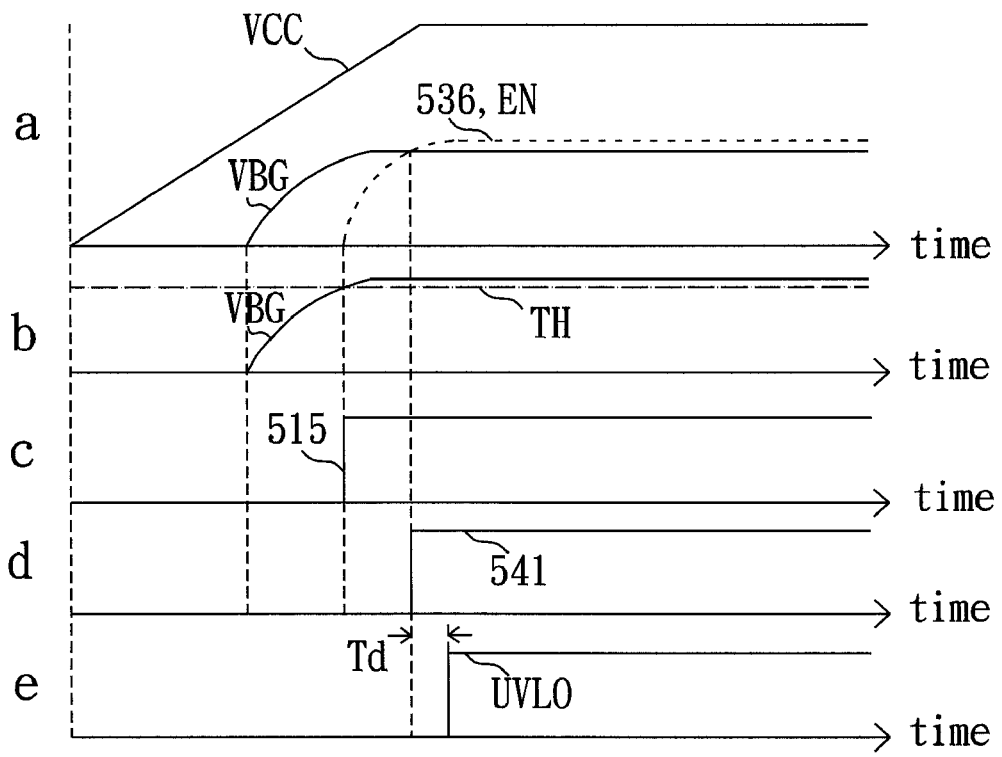
FIGS. 11a~11e are the timing diagrams of the voltage detection enabling circuit shown in FIG. 10.

Then please refer to FIG. 11b and 11c, when the reference voltage signal VBG is lower than the voltage parameter TH, the comparator 514 outputs high-level voltage signal 515. When the reference voltage signal VBG increases and reaches the level which is higher than the voltage parameter TH, the voltage signal 515 is then turned into low level.

Referring to FIG. 11a again, when the voltage signal 515 is high, the transistor switch 511 is conducted, so the enabling judgment signal EN and the driving divided voltage signal 536 at the voltage dividing point are grounded in order to restrain the voltage divider 535 from working. When the voltage signal 515 is turned into low, the transistor switch 511 is cut off. Then the voltage divider 535 starts to work, so the enabling judgment signal EN and the driving divided voltage signal 536 start to increase.

And as shown in FIG. 11d, only when the driving divided voltage signal 536 increases to the potential level which is higher than the reference voltage signal VBG, the comparator 540 outputs the high-level comparison signal 541. Then the comparison signal 541 is inverted to low level signal by the inverter 552. At the moment, the voltage signal 515 is low, thus the NOR gate 554 outputs the high-level enabling signal UVLO. In the meanwhile, the comparator 440 is enabled as a hysteresis comparator or the range of hysteresis voltage of the comparator 440 is adjusted, and the enabling signal UVLO is delayed to be outputted for a predetermined time Td.

As described in the above embodiments, the component parameter of the electronic components such as MOSFET and bipolar junction transistor will not be influenced by the application conditions of the electrical circuits. Therefore, they are suitable for determining the status of the reference voltage generating unit, in order to delay the enabling time of the circuit for avoiding the problems in prior techniques.

The description above only illustrates specific embodiments and examples of the invention. The invention should cover various modifications and variations made to the structures and operations described herein, and they still fall within the scope of the invention as defined in the following appended claims.

What is claimed is:

1. A voltage detection enabling circuit, which comprises:
 a reference voltage generating unit coupled with a driving voltage, in which the reference voltage generating unit is used for generating a reference voltage signal having a constant voltage level;
 an enabling protection unit receiving the reference voltage signal, in which the enabling protection unit outputs an enabling judgment signal if the reference voltage signal is higher than a predetermined transistor voltage parameter; and
 an enabling judgment unit having a comparator which includes an inverting input for insert of said reference voltage signal and a non-inverting input for receipt of a driving divided voltage signal, which determines whether an enabling signal is generated according to the enabling judgment signal and the driving voltage.

2. The voltage detection enabling circuit as described in claim 1, wherein the predetermined transistor voltage parameter is a threshold voltage of a transistor.

3. The voltage detection enabling circuit as described in claim 2, wherein the enabling protection unit includes said transistor having a control end, a first end, and a second end, in which the control end is coupled with the reference voltage generating unit, the first end is coupled with the enabling judgment unit, and the second end is coupled with a common potential.

4. The voltage detection enabling circuit as described in claim 2, wherein the enabling judgment unit comprises a voltage divider and said comparator, in which the voltage divider is coupled with the driving voltage and generates said driving divided voltage signal, and the comparator receives the dividing driving voltage signal and a comparison voltage signal for outputting a comparison signal.

5. The voltage detection enabling circuit as described in claim 4, further comprising a hysteresis enabling unit, which activates the comparator to be a hysteresis comparator when receiving the enabling signal.

6. The voltage detection enabling circuit as described in claim 4, wherein enabling protection unit comprises a transistor switch which is coupled with the voltage divider, in which the transistor switch is used for modulating the driving divided voltage signal when the reference voltage signal is lower than the voltage parameter.

7. The voltage detection enabling circuit as described in claim 4, wherein the enabling judgment unit further comprises a capacitor which is coupled with the voltage divider.

8. The voltage detection enabling circuit as described in claim 1, further comprising a delay circuit coupled with the enabling judgment unit, in which the delay circuit is used for delaying the output of the enabling signal for a predetermined time period.

9. A voltage detection enabling circuit, which comprises:
a reference voltage generating unit coupled with a driving voltage, in which the reference voltage generating unit is used for generating a reference voltage signal having a constant voltage level;
an enabling judgment unit having a comparator which includes an inverting input for insert of said reference voltage signal and a non-inverting input for receipt of a driving divided voltage signal, which is used for determining whether an enabling signal is generated according to a potential signal representative of the driving voltage; and
an enabling protection unit coupled with the enabling judgment unit, in which the enabling protection unit is used for determining whether the enabling judgment unit is stopped from generating the enabling signal according to the reference voltage signal.

10. The voltage detection enabling circuit as described in claim 9, wherein the enabling judgment unit comprises a voltage divider and the comparator, in which the voltage divider is coupled with the driving voltage and generates the driving divided voltage signal, and the comparator receives the driving divided voltage signal and a comparison voltage signal for outputting a comparison signal.

11. The voltage detection enabling circuit as described in claim 10, wherein the enabling protection unit modulates the potential of the driving divided voltage signal according to the reference voltage signal.

12. The voltage detection enabling circuit as described in claim 11, wherein the enabling protection unit comprises a transistor switch which is coupled with the voltage divider, in which the transistor switch is turned on for modulating the potential of the driving divided voltage signal when the reference voltage signal is lower than a voltage parameter, and the transistor switch is turned off for stopping modulating the potential of the driving divided voltage signal when the reference voltage signal is higher than the voltage parameter.

13. The voltage detection enabling circuit as described in claim 9, wherein the enabling protection unit comprises a transistor component which includes a control end, a first end, and a second end, in which the control end is coupled with reference voltage generating unit, the first end is coupled with the enabling judgment unit, and the second end is coupled with a common potential.

14. A controller, which comprises:
a voltage detection enabling circuit having a comparator which includes an inverting input for insert of a reference voltage signal and a non-inverting input for receipt of a driving divided voltage signal, which is coupled with a driving voltage for generating a reference voltage signal having a constant voltage level, and determining whether to generate an enabling signal when the reference voltage signal is higher than a voltage parameter representative of a transistor parameter;
an enabling protection unit receiving the reference voltage signal, in which the enabling protection unit outputs an enabling judgment signal if the reference voltage signal is higher than a predetermined transistor voltage parameter; and
a function circuit, which is coupled with the driving voltage to receive power for operating, and converts at least an input signal into at least an output signal according to a predetermined function when the function circuit receives the enabling signal.

15. The controller as in claim 14, wherein the voltage detection enabling circuit comprises the comparator and a voltage divider, in which the voltage divider is coupled with the driving voltage and generates the driving divided voltage signal, and the comparator compares the driving divided voltage signal with a comparison voltage signal, for outputting a comparison signal.

16. The controller as in claim 15, wherein the comparator is a hysteresis comparator, in which a range of hysteresis voltage of the hysteresis comparator is modulated when the driving voltage signal is higher than the comparison voltage signal.

17. The controller as in claim 15, wherein the voltage detection enabling circuit modulates the potential of the driving divided voltage signal when the reference voltage signal is lower than the voltage parameter.

* * * * *